United States Patent [19]
Liao et al.

[11] Patent Number: 5,583,070
[45] Date of Patent: Dec. 10, 1996

[54] PROCESS TO FORM RUGGED POLYCRYSTALLINE SILICON SURFACES

[75] Inventors: Chih-Cherng Liao; Haw Yen, both of Hsin Chu, Taiwan

[73] Assignee: Vanguard International Semiconductor Corporation, Hsin-Chu, Taiwan

[21] Appl. No.: 499,744

[22] Filed: Jul. 7, 1995

[51] Int. Cl.$^6$ .................................................. H01L 21/265
[52] U.S. Cl. .................................. 437/52; 437/47; 437/60; 437/919; 148/DIG. 14
[58] Field of Search .................................. 437/47, 60, 52, 437/919; 148/DIG. 14

[56] References Cited

U.S. PATENT DOCUMENTS

| | | | |
|---|---|---|---|
| 5,082,797 | 1/1992 | Chan et al. | 437/52 |
| 5,266,514 | 11/1993 | Tuan et al. | 437/52 |
| 5,278,091 | 1/1994 | Fazan et al. | 437/52 |
| 5,290,729 | 3/1994 | Hayashide et al. | 437/60 |
| 5,318,920 | 6/1994 | Hayashide | 148/DIG. 138 |
| 5,387,531 | 2/1995 | Rha et al. | 437/919 |
| 5,418,180 | 5/1995 | Brown | 437/60 |

*Primary Examiner*—Tuan H. Nguyen
*Attorney, Agent, or Firm*—George O. Saile

[57] ABSTRACT

A process for fabricating stacked capacitor, DRAM, devices, has been developed in which the surface area of the storage node has been significantly increased as a result of a unique set of deposition and annealing conditions. An amorphous polysilicon layer, used as the upper layer of the storage node, is ramped up in pure nitrogen, and then insitu annealed, to result in a polycrystalline structure, exhibiting significant surface area increases, due to the formation of surface concave and convex protrusions. The increase in storage node surface area allows for increased DRAM capacitance, without the use of larger dimension stacked capacitors, or thinner dielectrics.

18 Claims, 4 Drawing Sheets

5,583,070

PROCESS TO FORM RUGGED POLYCRYSTALLINE SILICON SURFACES

BACKGROUND OF THE INVENTION

1. Field of the Invention

The present invention relates to semiconductor devices, and more specifically to a process for fabricating high density, dynamic random accesss memory, (DRAM), devices.

2. Description of Prior Art

A majority of dynamic random access memory, (DRAM), devices, currently being manufactured in industry, have been fabricated using a stacked capacitor cell, (STC), technology. The basic DRAM memory cell is usually comprised of a transfer gate transistor and a connected capacitor, again usually a version of the stacked capacitor concept. Most designs, employing the STC technology, feature the connected capacitor, directly overlying the transfer gate transsitor, therefore the dimensions of the STC structure is uusally limited by the dimension of the underlying transfer gate structure. The STC structure is most cases is two conductive layers, such as polycrystalline silicon, with a dielectric layer sandwiched between the polycrystalline silicon layers. The ability to store charge is then a function of either the thickness, or the dielectric constant of the dielectric material, or the amount of surface area of the capacitor. Since the thickness of the dielectric can only be reduced to the range of approximately 100 Angstroms, without risking yield or reliability issues, the engineering community has concentrated on increasing the surface area of the STC structure, basically the bottom plate, or the storage node of the STC.

However as previously mentioned, the trend to high density components has resulted in smaller transfer gate structures, thus severely limiting the dimensions of the overlying STC structure. Therefore the industry has attempted to maintain capacitance by increasing the area of the conductive plates, even when the underlying access area, or transfer gate region, is decreasing in dimension. This is accomplished by a process which produces concaves and convexes on the surface of the lower electrode, thus creating increased surface area, without increasing the overall dimension of the DRAM cell. In U.S. Pat. No. 5,290,729, Hayashide, et al, describe a process for producing toughened storage node layers of polycrystalline silicon, or polycrystalline silicon having a surface of concaves and convexes. This is accomplished via specific deposition conditions and subsequent POC13 and oxidation processes. Also Fazan, et al, in U.S. Pat. No. 5,898,091, describe a different form of toughened polysilicon, used for the storage node layer. This invention will present a unique process for creating a polysilicon storage node layer, with a roughened, or rugged surface to increase capacitance. In addition this unique process will offer a large process window, allowing for easy incorporation into manufacturing.

SUMMARY OF THE INVENTION

It is an object of this invention to provide a method of fabricating DRAM devices using a stacked capacitor structure.

It is another object of this invention to use a a storage node capacitor in which the lower electrode is a composite composed of; an underlying intrinsic polysilicon layer, an insitu doped polysilicon layer, and an overlying, toughened, or rugged surface polysilicon layer.

It is yet another object of this invention to produce the rugged surface polysilicon layer via specific deposition conditions, and specific post deposition, insitu annealing conditions.

In accordance with the present invention a method is described for fabrication of a DRAM device, using a stacked capacitor structure, in which the lower electrode or storage node, is fabricated using a rugged surface polysilicon layer. The method consists of initially providing a transfer gate transistor, fabricated using conventional metal oxide semiconductor field effect transistor, (MOSFET), processing. The transfer gate transistor is formed by growing a thin gate oxide, followed by the creation of a polysilicon gate electrode structure. The gate electrode forms a portion of the DRAM word line. The N+ source and drain areas are formed in the surface of a P type silicon substrate, and after deposition of an insulator layer, access to an N+ region is created via photolithographic and dry etching processes. The stacked capacitor is now formed by initially creating the lower electrode, or storage node, from a deposition of composite polysilicon films, followed by specific annealing conditions needed to create the desired rugged polycrystalline silicon surface. This composite layer contacts an N+ region in the silicon substrate. The composite polysilicon layer is then patterned using photolithographic and dry etching processing. Next a thin dielectric composite layer, silicon oxynitride, silicon nitride, and silicon oxide is formed on the underlying composite polysilicon, storage node structure. Another deposition of polysilicon is then performed for purposes of creating the upper electrode, or cell plate of the stacked capacitor structure. After patterning of the cell plate, another insulator deposition is performed followed by hole openings to another N+ region for purposes of creating bit contacts.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming DRAM devices, with optimized storage node capacitor properties, will now be discribed in detail. Conventional DRAM stacked capacitor structures are currently being manufactured in industry, therefore only the specific area unique to understanding this invention will be covered in detail.

Figure 1:
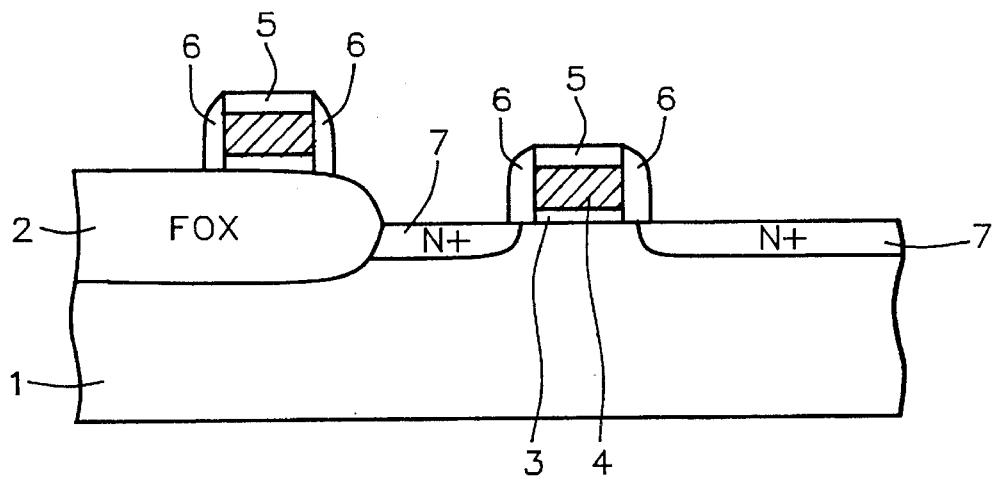
FIG. 1, which schematically shows in cross-sectional form, the transfer gate transistor section of the DRAM device.

FIG. 1 schematically illustrates a standard transfer gate transistor, used as part of the DRAM cell. Briefly, a substrate, 1, composed of P type, single crystalline silicon, with a <100> orientation is used. Field oxide, (FOX), regions, 2, are created for purposes of device isolation. The process used to create the FOX regions is to initially grow a thin thermal oxide, and then a thin silicon nitride layer, which will perform as art oxidation barrier, during the FOX oxidation process. The silicon nitride is obtained via low pressure chemical vapor deposition, (LPCVD), processing, at a thickness between about 850 to 500 Angstroms. After photolithographic and reactive ion etching, (RIE), processing, used to create the desired mask image, followed by removal of the masking photoresist, a field oxide, 2, is grown at a temperature between about 950° to 1050° C., to a thickness between about 4000 to 6000 Angstroms. After removal of the masking silicon nitride, in a hot phosphoric acid solution, followed by removal of the underlying thin thermal oxide, in a buffered hydrofluoric acid solution, a thin silicon dioxide gate is grown at a temperature between about 850° to 950° C., to a thickness between about 100 to 300 Angstroms. Next an insitu doped polysilicon layer, 4, is deposited, using LPCVD processing, at a temperature between about 550° to 850° C., to a thickness between about 2000 to 4000 Angstroms, using SiH4 and PH3.

A layer of silicon oxide, 5, is deposited, again using LPCVD processing, to a thickness between about 1000 to 3000 Angstroms. A polysilicon gate structure, 4, is created by standard photolithographic masking techniques, followed by RIE processing, which uses a CHF3 chemistry to etch silicon oxide layer, 5, and a HBr and C12 etch ambient to define the desired pattern in polysilicon layer, 4. After photoresist removal, via oxygen plasma ashing, and careful wet cleans, another silicon oxide layer, 6, is deposited, again using LPCVD processing. The structure is next subjected to an anisotropic RIE procedure in CHF3, to create a sidewall spacer, 6, on the polysilicon gate structure, 4. Heavily doped N+ source and drain regions, 7, are next formed via ion implantation of arsenic, at an energy between about 50 to 100 Kev., at a dose between about 1E14 to 5E15 atoms/cm2.

Figure 2:
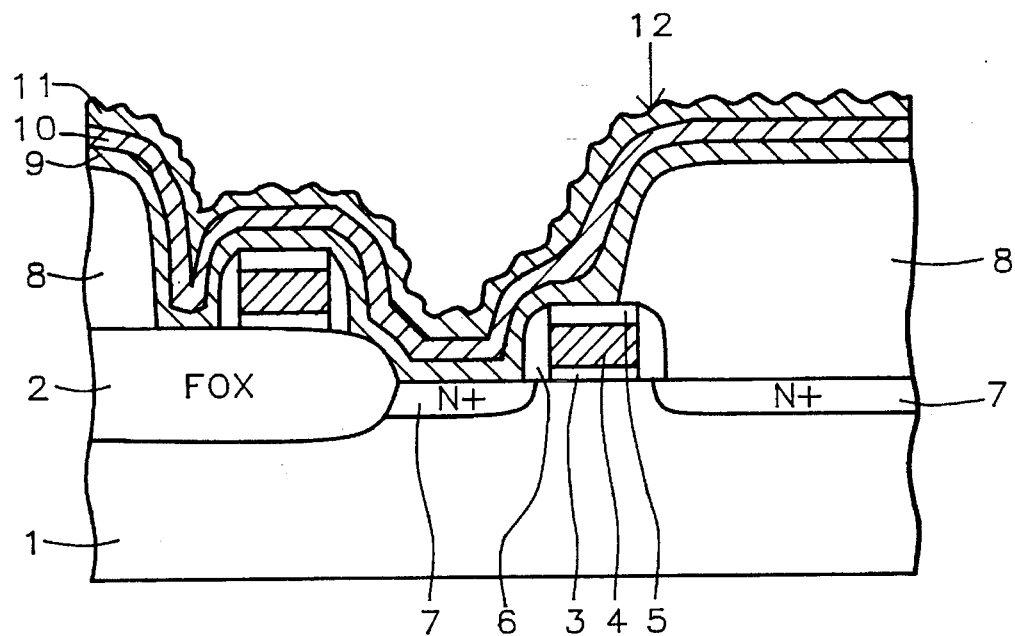
FIGS. 2–5, which are cross-sectional representations of the fabrication steps used to create the stacked capacitor portion of this invention.

FIG. 2, describes the initial stages of fabrication of the stacked capacitor structure. First a silicon oxide layer, 8, is deposited using LPCVD processing, at a temperature between about 580° to 680° C., to a thickness between about 500 to 2500 Angstroms. Next photolithographic and RIE techniques are used to remove silicon oxide 8, from an area over an N+ source and drain, 7, to allow for subsequent storage node contact. After photoresist removal, via oxygen plasma ashing, followed by a native oxide dip, for 90 sec., in a 200:1, dilute solution of hydrofluoric acid, the critical polysilicon deposition and annealing processes, used to create the storage node, of the stacked capacitor structure, are performed.

The objective of the polysilicon process is to produce a surface in which large concave and convex protrusions exist, thus enabling a significant increase in the storage node surface area to result. The polysilicon used for the storage node is deposited in three stages. First an intrinsic layer of polysilicon, 9, is deposited, using LPCVD processing, at a temperature between about 580° to 650° C., to a thickness between about 1500 to 2500 Angstroms. This is followed by another native oxide dip, again for 90 sec., using a 200:1 dilute solution of hydrofluoric acid. Next an insitu doped polysilicon layer, 10, is deposited, again via LPCVD processing, at a temperature between about 530° to 600° C., to a thickness between about 1500 to 4000 Angstroms, using SiH4 and PH3. The combination of an undoped underlay, and an insitu doped overlay, allow for the most rugged surfaces to be obtained from subsequent polysilicon depositions. Another native oxide removal procedure, identical to those previously performed and described, is again performed. The critical polysilicon layer, 11, allowing for the formation of a rugged surface, is now addressed. This is accomplished by LPCVD polysilicon deposition, at a temperature between about 510° to 600° C., at a pressure between about 0.15 to 0.25 Torr, via use of SiH4, and resulting in a thickness between about 500 to 1500 Angstroms. The resulting polysilicon layer, 11, is amorphous, however after an insitu ramp-up in high purity N2, followed by an insitu anneal at a temperature between about 530° to 600° C., at a pressure between about 0.2 to 1.0 Torr., a rugged polysilicon surface is achieved, shown as surface 12, in FIG. 8. It has been found that this set of conditions result in a storage node surface area increase of between about 40 to 80% when compared to counterparts faabricated with flat polysilicon.

Figure 3:
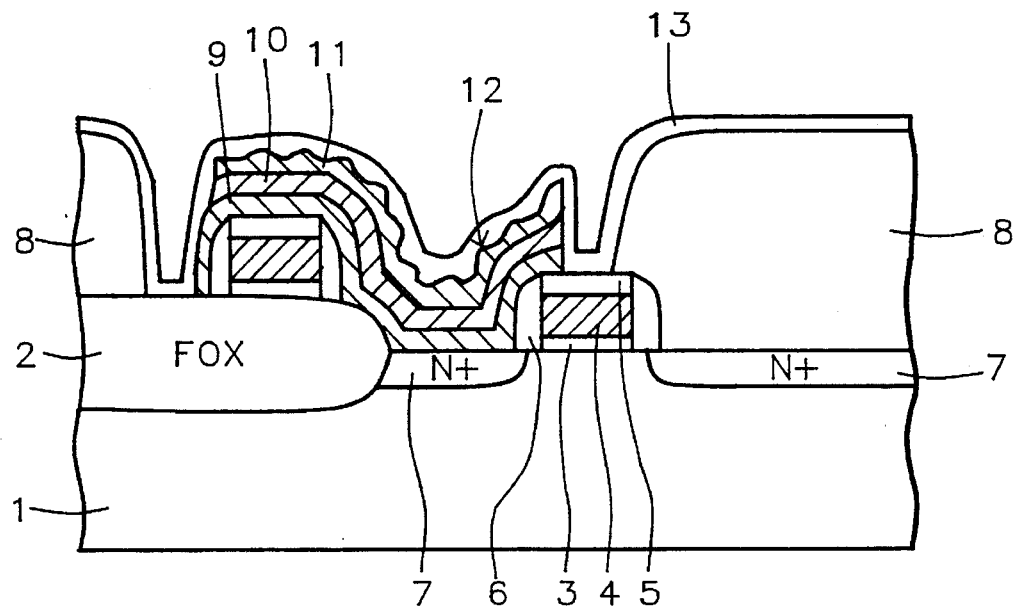

The composite polysilicon electrode is next patterned using standard photolithographic procedures, followed by an HBr and C12, RIE procedure, to produce the desired storage node configuration. After removal of the masking photoresist, via oxygen plasma ashing, followed by careful wet cleans, a critical dielectric layer, 13, is formed, basically on the rugged surface, 12. This is shown in FIG. 3. The dielectric layer, 13, is a composite dielectric consisting of silicon oxynitride—silicon nitride—silicon oxide, (ONO), and is created to offer an equivalent silicon dioxide thickness of between about 50 to 80 Angstroms. The ONO layer, 13, is achieved by initially creating a native silicon oxide on the underlying rugged polysilicon layer, 11, to a thickness between about 10 to 20 Angstroms. Next a thin layer of silicon nitride is deposited, using LPCVD processing, at a temperature between about 650° to 750° C., to a thickness between about 40 to 80 Angstroms. Finally the structure is subjected to a oxygen - steam envirnoment, at a temperature between about 850° to 900° C. for about 30 min., for purposes of converting the surface of the silicon nitride layer to a silicon oxynitride layer. Thus the formation of the ONO layer, 13, shown in FIG. 3, is complete.

Figure 4:
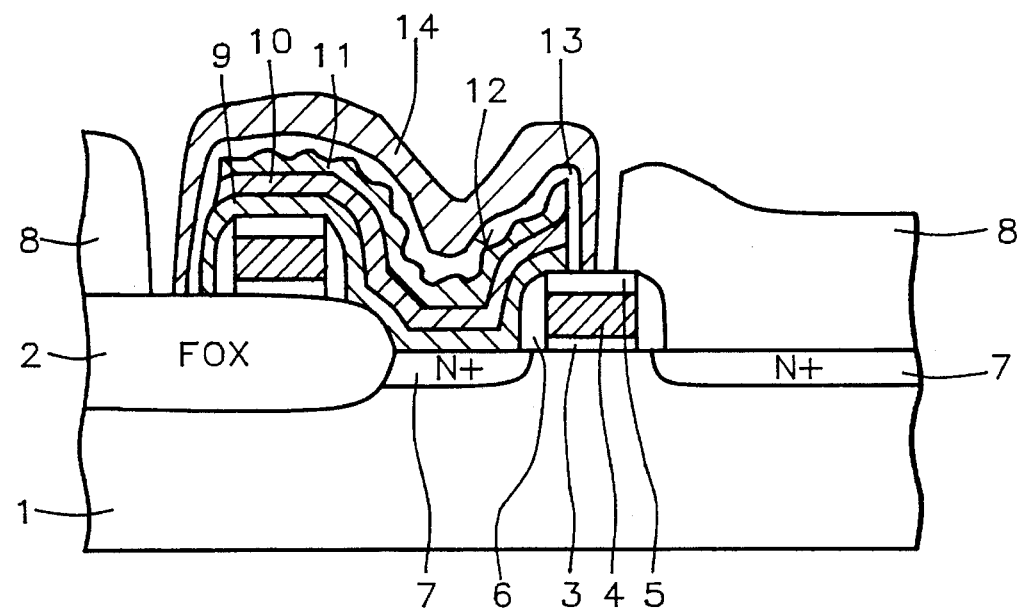
Figure 5:
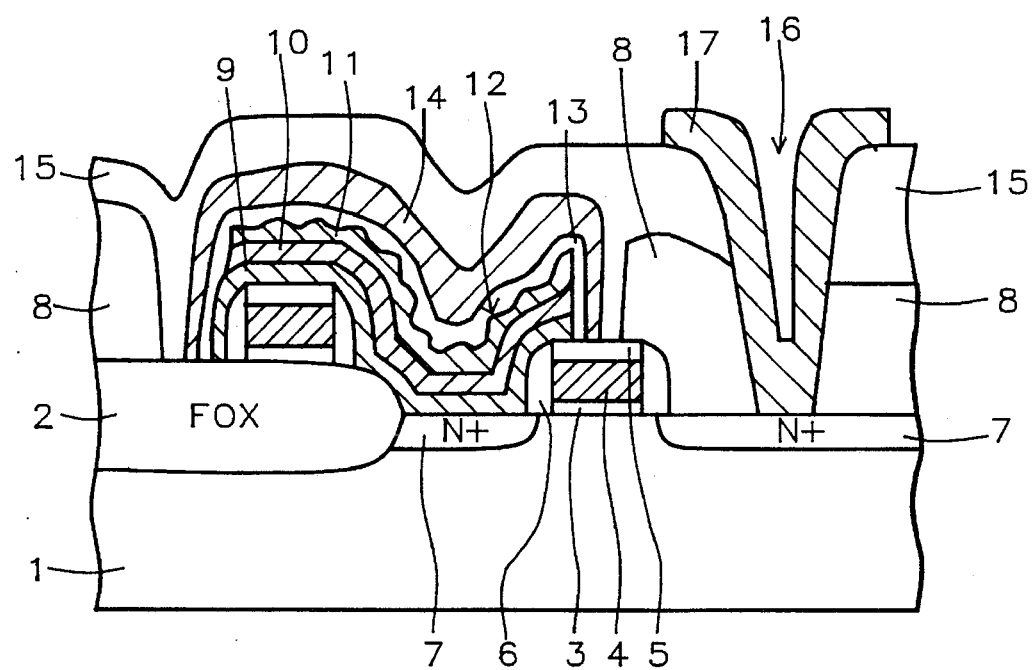

FIG. 4, shows the creation of the upper electrode, or cell plate, again fabricated using LPCVD, insitu doped, polysilicon, grown at a temperature between about 580° to 650° C., to a thickness between about 750 to 8500 Angstroms, using SiH4 and PH3. This is shown as layer 14, in FIG. 4. Standard photolithographic procedures, followed by an HBr and C12 RIE process, allow the desired cell plate configuration to be obtained. After photoresist removal, again via the use of oxygen plasma ashing, followed by wet chemical cleans, an insulator layer, 15, is deposited using LPCVD processing, at a temperature between about 650° to 950° C. to a thickness between about 1000 to 2000 Angstroms. Standard photolithographic procedures and RIE processing, using CHF3, are used to open contact hole 16, to N+ region, 7. After photoresist removal and wet cleans, a deposition of aluminum - copper - silicon, or tungsten is performed to a thickness between about 3000 to 5000 Angstroms, using r.f. sputtering for the aluminum based metallization, while chemical vapor deposition is used to provide the tungsten films. Again photolithographic and RIE procedures, using a C12 chemistry, are employed to form metal structure, 17, shown schematically in FIG. 5. Photoresist removal, using oxygen plasma ashing, followed by careful wet cleans are then performed.

Figure 6:
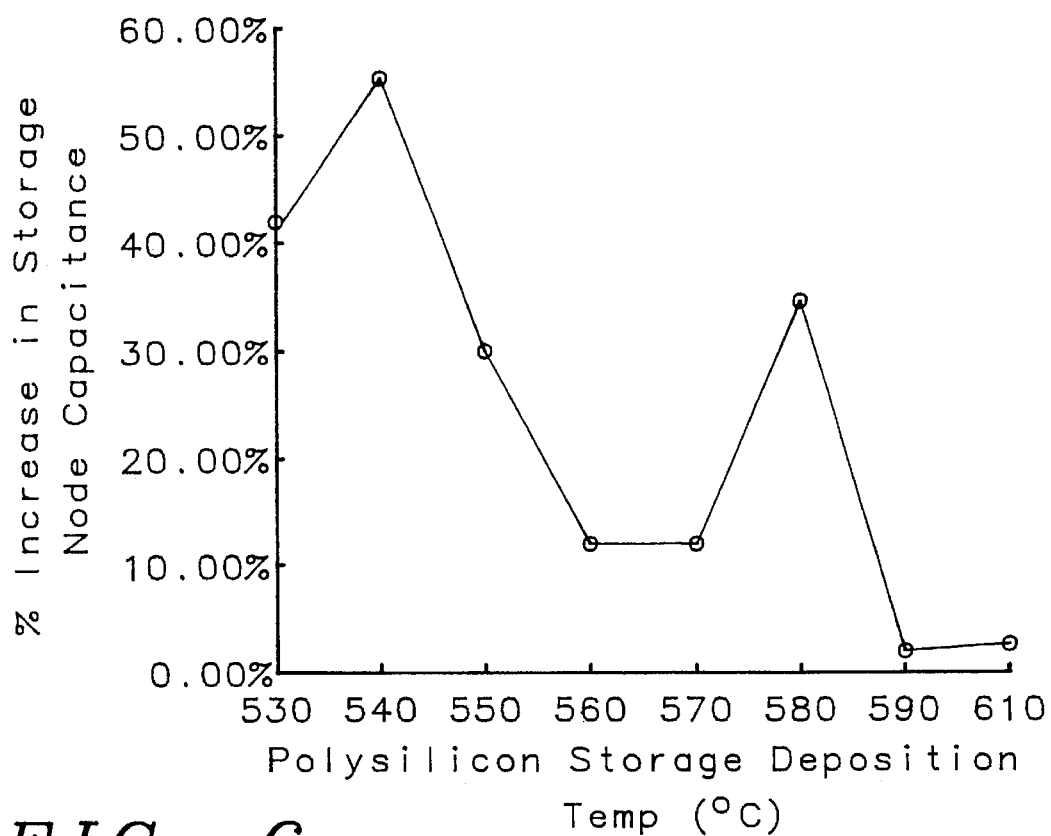
FIG. 6, graphically showing the relationship between increasing capacitor area, due to the rugged surface polysilicon, as a function of polysilicon deposition temperature.
Figure 7:
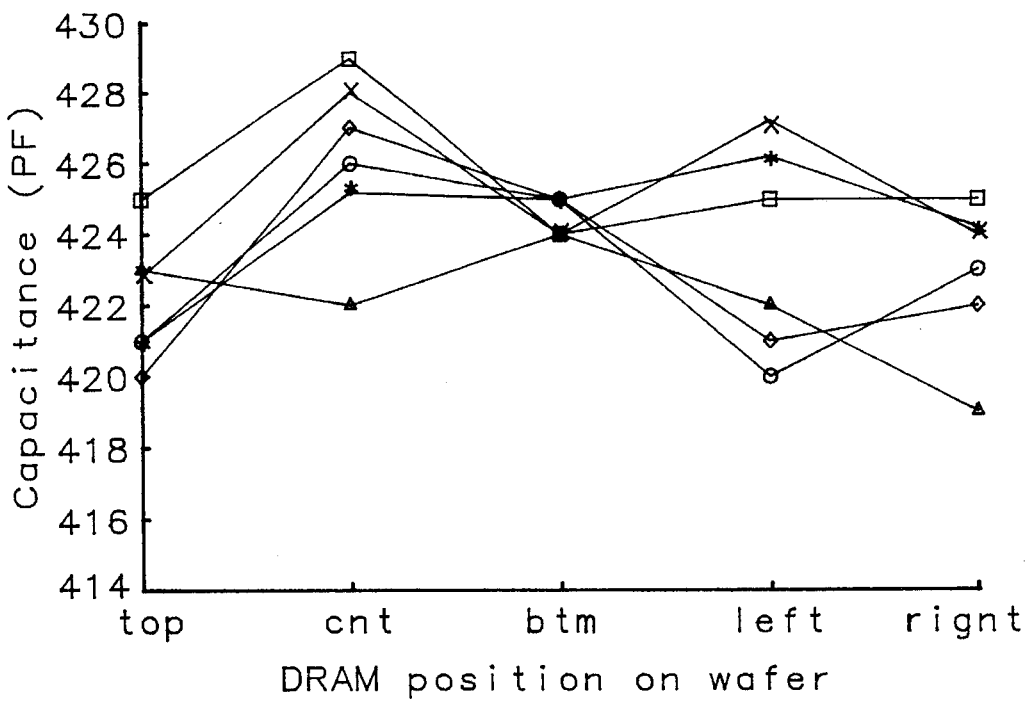
FIG. 7, graphically indicating the uniformity of the capacitance of DRAM devices, as a function of their specific device position on the starting silicon wafer.

FIG. 6, illustrates the advantages of this invention. The percentage increase in storage node capacitance is plotted as a function of the deposition temperature of the polysilicon layer, used to produce the rugged surface. The samples used to establish the relationship, shown in FIG. 6, were subjected to the insitu anneal, also described in this invention. It can be seen that capacitance increases, between about 20 to 60%, can be obtained using the process described in this invention. FIG. 7, illustrates the uniformity of the rugged surface, across the 200 mm silicon wafer. It can be seen that less than a 10 pf delta is observed for DRAM devices fabricated across the wafer. Equally impressive is the uniformity, from wafer to wafer, and from run to run, also, experienced with this process.

While this invention has been particularly shown and described with reference to the preferred embodiments thereof, it will be understood by those skilled in the art that various changes in form and details may be made without departing from the spirit and scope of the invention.

What is claimed is:

1. A method for fabricating stacked capacitor, dynamic random access memory, (DRAM), devices on a semiconductor substrate, comprising the steps of:

providing a transfers gate transistor, with a first N type doped region, and a second N type doped region, in said semiconductor substrate;

depositing a first insulator layer on said transfer gate transistor, including deposition on said first N type doped region and on said second N type doped region;

opening a first contact hole, in said first insulator layer, to expose said first N type doped region, in said transfer gate transistor;

depositing an undoped, first polysilicon layer on said transfer gate transistor, contacting said first N type doped region, in said first contact hole;

depositing an insitu doped, second polysilicon layer on said first polysilicon layer;

depositing a third polysilicon layer on said doped, second polysilicon layer;

insitu annealing of said third polysilicon layer, to increase surface roughness of said third polysilicon layer;

patterning of said first polysilicon layer, said doped, second polysilicon layer, and said third polysilicon layer, to form lower electrode structure;

forming a composite dielectric layer on surface of said third polysilicon layer, and on said transfer gate transistor, not covered by said lower electrode structure;

depositing a fourth polysilicon layer on said composite dielectric layer;

patterning of said fourth polysilicon layer, to form upper electrode structure;

depositing a second insulator layer on said upper electrode structure, and on said transfer gate transistor, not covered by said upper electrode structure;

opening a second contact hole, in said second insulator layer, to expose said second N type doped region, in said transfer gate transistor;

depositing a metal layer on said upper electrode structure, and on said transfer gate transistor, and contacting said second N type region, in said second contact hole; and patterning said metal layer to form metal contact to said second N type region.

2. The method of claim 1, wherein said transfer gate transistor is an N type, field effect transistor, with a silicon dioxide gate insulator of between about 100 to 300 Angstroms.

3. The method of claim 1, wherein said first polysilicon layer, is deposited intrinsically using LPCVD processing, at a temperature between about 580° to 650° C., to a thickness between about 1500 to 2500 Angstroms, using SiH4.

4. The method of claim 1, wherein said doped, second polysilicon layer is deposited using an LPCVD, insitu doping, process, at a temperature between about 530° to 600° C., to a thickness between about 1500 to 4000 Angstroms, using a flow between about 1000 to 1500 sccm of SiH4, and a flow between about 100 to 300 sccm of PH3.

5. The method of claim 1, wherein said third polysilicon layer is deposited intrinsically, using LPCVD processing, at a temperature between about 510° to 600° C., to a thickness between about 500 to 1500 Angstroms, using SiH4, at a pressure between about 0.15 to 0.25 Torr.

6. The method of claim 1, wherein said insitu annealing is performed, in an LPCVD system, at a temperature between about 530° to 600° C., at a pressure between about 0.2 to 1.0 Torr.

7. The method of claim 1, wherein surface area of said third polysilicon layer is increased by 40 to 80%, as a result of said insitu anneal.

8. The method of claim 1, wherein said composite dielectric layer is composed of silicon oxynitride - silicon nitride - silicon dioxide, obtained by: native oxide growth on said third polysilicon layer, to a thickness between about 10 to 20 Angstroms; deposition of a silicon nitride layer, using LPCVD processing, at a temperature between about 650° to 750° C., to a thickness between about 40 to 80 Angstroms; and an oxidation of said silicon nitride layer, at a temperature between about 850° to 900° C., in an oxygen -steam ambient, to form between about 10 to 30 Angstroms of silicon oxynitride.

9. The method of claim 1, wherein said fourth polysilicon layer is deposited using an LPCVD, insitu doping process, at a temperature between about 580° C. to 650° C., to a thickness between about 750 to 2500 Angstroms, using a SiH4 flow between about 1000 to 1500 sccm, and a PH3 flow between about 100 to 300 sccm.

10. A method for fabricating stacked capacitor, dynamic random access memory, (DRAM), devices, on a semiconductor substrate, comprising the steps of:

providing a transfer gate transistor, with a first N type source and drain region, and a second N type source and drain region, in said semiconductor substrate;

depositing a first insulator layer on said transfer gate transistor, including deposition on said first N type source and drain region and on said second N type source and drain region;

opening a first contact hole, in said first insulator layer, to expose said first N type source and drain region, in said transfer gate transistor;

depositing an undoped first polysilicon layer on said transfer gate transistor, contacting said first N type source and drain region, in said first contact hole;

depositing an insitu doped, second polysilicon layer on said first polysilicon layer;

depositing an amorphous, third polysilicon layer on said doped, second polysilicon layer;

insitu annealing of said amorphous, third polysilicon layer, to convert said amorphous, third polysilicon layer, to a roughened surface, third polysilicon layer;

patterning of said first polysilicon layer, said doped, second polysilicon layer, and said roughened surface, third polysilicon layer, to form storage node structure, of said stacked capacitor structure;

forming a composite dielectric layer, on said roughened surface, third polysilicon layer, and on said transfer gate transistor, not covered by said storage node structure;

depositing a fourth polysilicon layer on said composite dielectric layer;

patterning of said fourth polysilicon layer, to form cell plate structure, of said stacked capacitor structure;

depositing a second insulator layer on said cell plate structure, and on said transfer gate transistor, not covered by said stacked capacitor structure;

opening a second contact hole, in said second insulator layer, to expose said second N type source and drain region, in said transfer gate transistor;

depositing a metal layer on said cell plate structure, and on said transfer gate transistor, and contacting said second N type source and drain region, in said second contact hole; and patterning of said metal layer to form metal contact to said second N type source and drain region.

11. The method of claim 10, wherein said transfer gate transistor is an N type, field effect transistor, with a silicon dioxide gate insulator of between about 100 to 300 Angstroms.

12. The method of claim 10, wherein said first polysilicon layer is deposited intrinsically, using LPCVD processing, at a temperature between about 580° to 650° C., to a thickness between about 1500 to 2500 Angstroms, using SiH4.

13. The method of claim 10, wherein said doped second polysilicon layer is deposited using an LPCVD, insitu doped, process, at a temperature between about 530 to 600° C., to a thickness between about 1500 to 4000 Angstroms, using a flow between about 1000 to 1500 sccm of SiH4, and a flow between about 100 to 300 sccm of PH3.

14. The method of claim 10, wherein said amorphous, third polysilicon layer is deposited intrinsically, using LPCVD processing at a temperature between about 510° to 600° C., to a thickness between about 500 to 1500 Angstroms, using SiH4, at a pressure between about 0.15 to 0.25 Torr.

15. The method of claim 10, wherein said insitu annealing, of said amorphous, third polysilicon layer is performed, in an LPCVD system, at a temperature between about 530° to 600° C., at a pressure between about 0.2 to 1.0 Torr.

16. The method of claim 10, wherein surface area of said roughened surface, third polysilicon layer, is increased by between about 40 to 80%, as a result of conversion from said amorphous, third polysilicon layer, via use of said insitu annealing.

17. The method of claim 10, wherein said composite dielectric layer is composed of silicon oxynitride - silicon nitride - silicon dioxide, obtained by: native oxide growth on said toughened surface, third polysilicon layer, to a thickness between about 10 to 20 Angstroms; deposition of a silicon nitride layer, using LPCVD processing, at a temperature between about 650° to 750° C., to a thickness between about 40 to 80 Angstroms; and an oxidation of said silicon nitride layer, at a temperature between about 850° to 950° C., in an oxygen—steam ambient, to form between about 10 to 30 Angstroms of silicon oxynitride.

18. The method of claim 10, wherein said fourth polysilicon layer is deposited using an LPCVD, insitu doped, process, at a temperature between about 580° to 650° C., to a thickness between about 750 to 2500 Angstroms, using a SiH4 flow between about 1000 to 1500 sccm, and a PH3 flow between about 100 to 300 sccm.

* * * * *